(12) United States Patent
Hasegawa et al.

(10) Patent No.: US 6,613,625 B1
(45) Date of Patent: Sep. 2, 2003

(54) METHOD OF MANUFACTURING A SEMICONDUCTOR DEVICE

(75) Inventors: Hisashi Hasegawa, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/177,833

(22) Filed: Jun. 21, 2002

(51) Int. Cl.$^7$ .......................................... H01L 21/8238
(52) U.S. Cl. ...................... 438/210; 438/238; 438/382; 438/384
(58) Field of Search ................................ 438/210, 238, 438/382, 384, 385, 383

(56) References Cited

U.S. PATENT DOCUMENTS 6,110,772 A * 8/2000 Takada et al. ............... 438/238
6,204,105 B1 * 3/2001 Jung ........................... 438/238

* cited by examiner

*Primary Examiner*—Phat X. Cao
*Assistant Examiner*—Theresa T. Doan
(74) *Attorney, Agent, or Firm*—Adams & Wilks

(57) ABSTRACT

There is provided a manufacturing method using a structure capable of realizing a power management semiconductor device and an analog semiconductor device, in which low costs, short manufacturing periods, and low voltage operation are possible, which have low consumption power, high drive power, high grade function, and high accuracy. With respect to the power management semiconductor device and the analog semiconductor device which each include a CMOS transistor and a resistor, the manufacturing method is a method of obtaining a P-type polycide structure as a laminate structure of a P-type polycrystalline silicon film and a high melting point metallic silicide film for respective gate electrodes of an NMOS transistor and a PMOS transistor as divided by a conductivity type thereof in a CMOS transistor. In addition, the manufacturing method is a semiconductor device manufacturing method of forming a resistor used for a voltage dividing circuit and a CR circuit using a polycrystalline silicon film as a layer different from the gate electrode so that a higher accurate resistor can be obtained. Thus, as compared with a conventional CMOS transistor having an N$^+$-type polycrystalline silicon gate unipole and a conventional homopolar gate CMOS transistor in which the channel and the gate electrode have the same polarity, it is an advantage in costs, manufacturing periods, and element performances. In addition, a power management semiconductor device and an analog semiconductor device which have high-grade function and high accuracy can be realized.

8 Claims, 4 Drawing Sheets

METHOD OF MANUFACTURING A SEMICONDUCTOR DEVICE

BACKGROUND OF THE INVENTION

1. Field of the Invention

The present invention relates to a method of manufacturing a complementary MOS semiconductor device having a resistor circuit, for which low voltage operation, low consumption power, and high drive power are required, more particularly, a power management semiconductor device such as a voltage detector (hereinafter referred to as a VD), a voltage regulator (hereinafter referred to as a VR), or a switching regulator (hereinafter referred to as an SWR), or an analog semiconductor device such as an operational amplifier or a comparator.

2. Description of the Related Art

Conventionally, many kinds of complementary MOS semiconductor devices having a resistor circuit using a resistor made of polycrystalline silicon or the like are used. FIG. 3 shows an example of a structure of a conventional semiconductor device having a resistor circuit. The semiconductor device is composed of an N-channel MOS 214 (hereinafter referred to as an NMOS) transistor in which the gate electrode formed to a P-type semiconductor substrate 201 is made of N$^+$-type polycrystalline silicon 221, a P-channel MOS 215 (hereinafter referred to as a PMOS) transistor in which the gate electrode formed to an N-well region is made of N$^+$-type polycrystalline silicon 221 as in the case of the NMOS 214, and a resistor used for a voltage dividing circuit for dividing a voltage, a CR circuit for setting a time constant, or the like, which is formed on a field insulating film 206. A complementary MOS (hereinafter referred to as a CMOS) structure is obtained by the NMOS transistor and the PMOS transistor.

In the complementary MOS (CMOS) semiconductor device having the resistor circuit, the N$^+$-type polycrystalline silicon is often used for the gate electrode in view of a polarity thereof because of ease of manufacturing and stability of operation. In this case, from a relationship of work function between the gate electrode and the semiconductor substrate (well region), the NMOS transistor becomes a surface channel type. On the other hand, in the case of the PMOS transistor, a threshold voltage becomes about −1 V from the relationship of work function between the gate electrode and the semiconductor substrate. Thus, when impurity implantation is conducted for reducing the threshold voltage, the PMOS transistor becomes a buried channel type in which a channel is formed in the inner portion of the substrate, which is slightly deeper than the surface thereof. The buried channel type has an advantage of high mobility because a carrier is transferred through the inner portion of the substrate. However, when the threshold voltage is reduced, a subthreshold characteristic is greatly deteriorated, thereby increasing a leak current. Thus, it is difficult for the PMOS transistor to reduce a voltage and shorten a channel as compared with the NMOS transistor.

Also, as a structure capable of reducing a voltage in both the NMOS transistor and the PMOS transistor, there is a homopolar gate structure in which the polarity of the gate electrode is set to be equal to that of the transistor. According to this structure, U-polycrystalline silicon is used for the gate electrode of the NMOS transistor and P$^+$-polycrystalline silicon is used for the gate electrode of the PMOS transistor. Thus, each transistor becomes a surface channel type. As a result, a leak current can be suppressed and a voltage can be reduced. However, there are the following problems in costs and characteristics. That is, when the gate electrodes having different polarities are formed, the number of manufacturing steps is increased and increases in a manufacturing cost and a manufacturing period are caused. Further, with respect to an inverter circuit as a most fundamental circuit element, generally, in order to improve area efficiency, the layout for the gate electrodes of the NMOS transistor and the PMOS transistor is made such that a connection through metal is avoided and a piece of polycrystalline silicon which is two-dimensionally continued from the NMOS transistor to the PMOS transistor or a polycide structure composed of a laminate of a polycrystalline silicon film and a high melting point metallic silicide film is used. Here, when the gate electrode is made of polycrystalline silicon 221,222 as a single layer as shown in FIG. 4, it is impractical because of a high impedance of a PN junction in the polycrystalline silicon. Also, when the gate electrode has a polycide structure as shown in FIG. 5, an N-type impurity and a P-type impurity each are diffused to respective gate electrodes having an inverse conductivity type through high melting point metallic silicide films 212 at high speed during heat treatment of steps. As a result, a work function is changed and a threshold voltage is unstable.

SUMMARY OF THE INVENTION

In order to solve the above problems, the following means is used for the present invention.

(1) According to the present invention, there is provided a method of manufacturing a semiconductor device comprising:

forming an element isolation insulating film on a semiconductor substrate by thermal oxidation;

forming a gate insulating film on the semiconductor substrate by thermal oxidation;

depositing a first polycrystalline silicon film at a thickness of 500 angstroms to 2500 angstroms on the gate insulating film;

doping the first polycrystalline silicon film with an impurity such that a concentration of the impurity is $1 \times 10^{18}$ atoms/cm$^3$ or higher to make a conductivity type of the first polycrystalline silicon film a P-type;

depositing a high melting point metallic silicide film having a thickness of 500 angstroms to 2500 angstroms on the first polycrystalline silicon film having the P-type;

depositing an insulating film having a thickness of 500 angstroms to 3000 angstroms on the high melting point metallic silicide film;

etching the first polycrystalline silicon film having the P-type, the high melting point metallic silicide film, and the insulating film to form a gate electrode;

depositing a second polycrystalline silicon film having a thickness of 500 angstroms to 2500 angstroms on the element isolation insulating film;

doping one of an entire region and a first region of the second polycrystalline silicon film with a first conductivity type impurity at a concentration of $1 \times 10^{14}$ atoms/cm$^3$ to $9 \times 10^{18}$ atoms/cm$^3$;

doping a second region of the second polycrystalline silicon film with a second conductivity type impurity at a concentration of $1 \times 10^{14}$ atoms/cm$^3$ to $9 \times 10^{18}$ atoms/cm$^3$;

etching the second polycrystalline silicon film to form a resistor composed of the second polycrystalline silicon film;

doping one of a portion of and an entire region of the first region of the second polycrystalline silicon film with the first conductivity type impurity at a concentration of $1\times10^{19}$ atoms/cm$^3$ or higher;

doping one of a portion and an entire region of the second region of the second polycrystalline silicon film with the second conductivity type impurity at a concentration of $1\times10^{19}$ atoms/cm$^3$ or higher;

forming an intermediate insulating film over the semiconductor substrate;

forming a contact hole in the intermediate insulating film over the semiconductor substrate; and providing a metallic wiring in the contact hole.

(2) In the method of manufacturing a semiconductor device of the present invention, an impurity introducing method for the first polycrystalline silicon film is for an ion implantation of boron.

(3) In the method of manufacturing a semiconductor device of the present invention, an impurity introducing method for the first polycrystalline silicon film is for an ion implantation of $BF_2$.

(4) In the method of manufacturing a semiconductor device of the present invention, an impurity introducing method for the first polycrystalline silicon film is a doped-CVD method of depositing the first polycrystalline silicon film while the impurity is mixed thereinto.

(5) In the method of manufacturing a semiconductor device of the present invention, the insulating film deposited on the high melting point metallic silicide film is composed of an oxide film.

(6) In the method of manufacturing a semiconductor device of the present invention, the insulating film deposited on the high melting point metallic silicide film is composed of a nitride film.

(7) In the method of manufacturing a semiconductor device of the present invention, the insulating film deposited on the high melting point metallic silicide film is composed of a laminate of a first oxide film, a nitride film, and a second oxide film.

(8) In the method of manufacturing a semiconductor device of the present invention, doping of the first conductivity type impurity at a concentration of $1\times10^{19}$ atoms/cm$^3$ or higher to one of the portion and the entire region of the first region of the second polycrystalline silicon film is performed simultaneously with doping to a diffusion region of a first conductivity type MOS transistor, and doping of the second conductivity type impurity at a concentration of $1\times10^{19}$ atoms/cm$^3$ or higher to one of the portion and the entire region of the second region of the second polycrystalline silicon film is performed simultaneously with doping to a diffusion region of a second conductivity type MOS transistor.

DETAILED DESCRIPTION OF THE PREFERRED EMBODIMENT

Hereinafter, an embodiment of the present invention will be described in detail based on the drawings.

Figure 1:
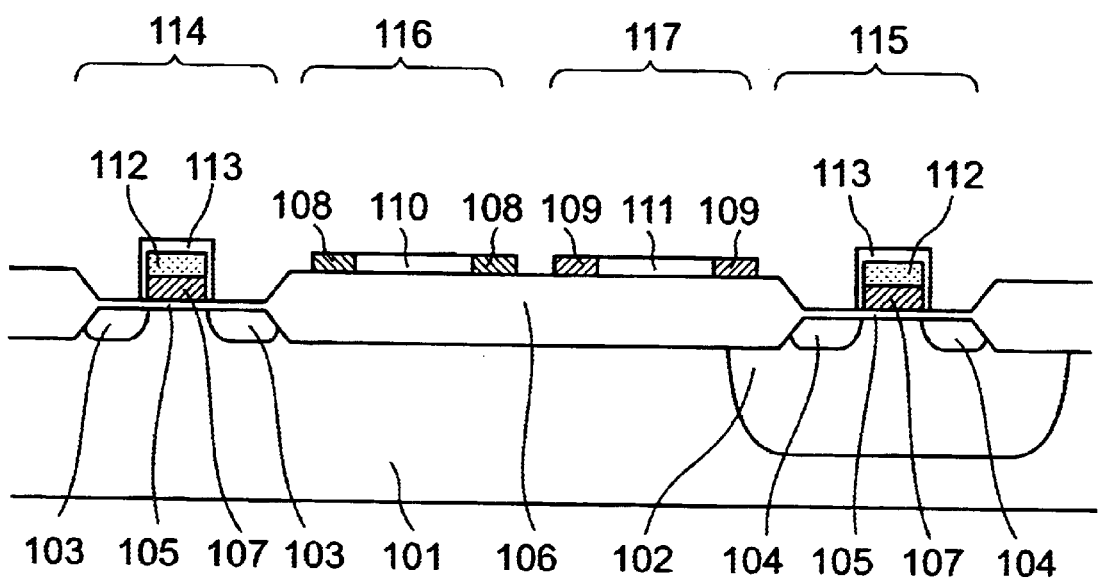
FIG. 1 is a schematic cross sectional view showing a CMOS semiconductor device according to an embodiment of the present invention.

FIG. 1 is a cross sectional view showing a CMOS semiconductor device having a resistor circuit according to an embodiment of the present invention.

In this embodiment, an N-type well diffusion layer region 102 is formed in a P-type silicon semiconductor substrate 101 and has a conductivity type opposite to the substrate. Further, impurity diffusion layers each having a conductivity type opposite to the silicon semiconductor substrate 101 are formed therein for an N-type MOS transistor 114. Impurity diffusion layers each having a conductivity type opposite to the N-type well diffusion layer region 102 are formed therein for a P-type MOS transistor 115. Each of the transistors is composed of a gate insulating film 105 and a gate electrode in addition to the impurity diffusion layer. The gate electrode has a laminate polycide structure of a P$^+$-type polycrystalline silicon film 107 and a high melting point metallic silicide film 112. An oxide insulating film 113 is deposited on the gate electrode as a mask material therefor. Here, a nitride film may be used as the mask material for the gate electrode. In addition, the P-type silicon semiconductor substrate is used here. However, a P-type well diffusion layer may be formed in an N-type silicon substrate so as to construct a CMOS semiconductor device thereto.

Also, in this embodiment, a polycrystalline silicon resistor 116 which is made from a second polycrystalline silicon film and has an N-type as a first conductivity type and a polycrystalline silicon resistor 117 which is made from the second polycrystalline silicon film and has a P-type as a second conductivity type are formed on a field insulating film 106. Here, the polycrystalline silicon film 107 as a portion of the gate electrode in the CMOS transistor and the polycrystalline silicon resistors 116 and 117 are formed in separate steps and have different film thicknesses. The polycrystalline silicon resistors are formed to be thinner than the gate electrode. For example, the film thickness of the gate electrode is about 2000 angstroms to 6000 angstroms. On the other hand, the film thickness of the respective resistors is 500 angstroms to 2500 angstroms. When the polycrystalline silicon resistors are thin, a high sheet resistance value can be set and a temperature characteristic becomes preferable. Thus, the accuracy of resistor can be further improved.

The N-type polycrystalline silicon resistor 116 includes a high resistance region 110 and high concentration impurity regions 108 which are provided in both end portions of the resistor such that they are in sufficiently contact with wiring materials. The impurity concentration of the high resistance region 110 is controlled by ion implantation, thereby forming the resistors each having a desirable resistance value. Similarly, the P-type polycrystalline silicon resistor 117 includes a high resistance region 111 and high concentration impurity regions 109. A resistance value is set in accordance with the impurity concentration of the high resistance region.

For example, a sheet resistance value is dependent on a use of the resistor. In the case of a general voltage dividing circuit, the sheet resistance value from several kΩ/square to several tens kΩ/square is used. In this time, boron or $BF_2$ is used as an impurity for the P-type resistor 117 and the concentration thereof is about $1 \times 10^{14}$ atoms/cm$^3$ to $9 \times 10^{18}$ atoms/cm$^3$. Phosphorus or arsenic is used as an impurity for the N-type resistor 116 and the concentration thereof is about $1 \times 10^{14}$ atoms/cm$^3$ to $9 \times 10^{18}$ atoms/cm$^3$.

Also, both the N-type resistor 116 and the P-type resistor 117 are shown in FIG. 1. However, in order to reduce the number of steps and costs in view of characteristics of those resistors and properties thereof required for a product, there is the case where only one of the N-type resistor 116 and the P-type resistor 117 is mounted.

Thus, when the gate electrode is set to be the P$^+$-type, the PMOS transistor becomes the surface channel type. Therefore, even when the threshold voltage is reduced, a leak current can be suppressed as compared with the buried channel type. On the other hand, in the case of the NMOS transistor, when the gate electrode is set to be the P$^+$-type, it becomes the buried channel type. Here, arsenic having a smaller diffusion coefficient than boron is used as an impurity to be implanted for reducing the threshold voltage. Thus, the NMOS transistor becomes a state similar to the surface channel type as compared with the PMOS transistor using an N$^+$-type gate electrode. In addition, arsenic has the property of condensing near an interface between the silicon film and the oxide film. Therefore, the NMOS transistor further approaches a state similar to the surface channel type. As a result, even when the threshold voltage is reduced in the N-type MOS transistor, a leak current can be suppressed and low voltage operation is possible. With respect to the homopolar gate structure, when the respective gate electrodes of the N-type MOS transistor and the P-type MOS transistor are set to be the P$^+$-type, manufacturing steps are simplified and costs can be reduced.

From the above description, a method of manufacturing the CMOS transistor using a P$^+$-type polycrystalline silicon unipole as the gate electrode according to the present invention becomes a technique effective for low voltage operation and low consumption power as compared with a method of manufacturing a conventional COS transistor using an N$^+$-type polycrystalline silicon unipole as the gate electrode.

Steps of manufacturing the semiconductor device of the embodiment shown in FIG. 1 will be described with referent to FIGS. 2A to 2H.

Figure 2A:
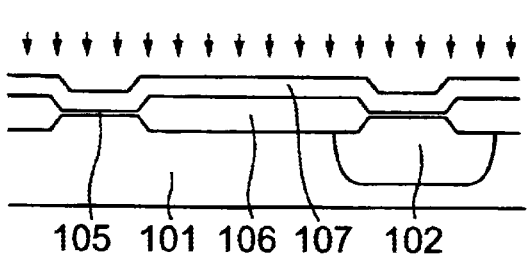
FIGS. 2A to 2H are cross sectional views showing a method of manufacturing the CMOS semiconductor device in step order according to the present invention.
Figure 2B:
Figure 2C:
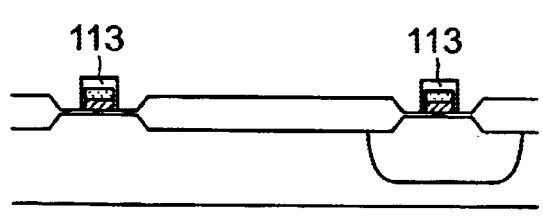

For example, phosphorus ions are implanted into the P-type silicon semiconductor substrate 101 and annealing is performed at 1000° C. to 1175° C. for 3 hours to 20 hours. Thus, the phosphorus ions are diffused to form the N-type well diffusion layer 102 having an impurity concentration of about $1 \times 10^{16}$ atoms/cm$^3$. Subsequently, the field insulating film 106 is formed by a LOCOS method, a gate insulating film 105 is formed at a film thickness of about 100 angstroms to 300 angstroms by thermal oxidation, and ion implantation is performed for obtaining a predetermined threshold voltage. After that, a first polycrystalline silicon film is deposited at a film thickness of about 500 angstroms to 2500 angstroms by a low pressure CVD method. Then, boron ions or BF$^+$ ions are implanted into the first polycrystalline silicon film such that the impurity concentration thereof is equal to or higher than $1 \times 10^{18}$ atoms/cm$^3$, thereby forming the P$^+$-type polycrystalline silicon film 107 (FIG. 2A). Here, the P$^+$-type polycrystalline silicon film is formed by ion implantation. The P$^+$-type polycrystalline silicon film may be formed by a doped-CVD method of depositing a polycrystalline silicon film while an impurity such as boron is mixed thereinto. After that, a tungsten silicide film as the high melting point metallic silicide film 112 is deposited on the P$^+$-type polycrystalline silicon film by a sputtering method or the like. Note that, here, the tungsten silicide film is used as the high melting point metallic silicide film. A molybdenum silicide film, a titanium silicide film, or a platinum silicide film can be also used. Then, the oxide insulating film 113 as a mask material for preventing introduction of an N-type impurity into a P$^+$-type gate electrode is deposited on the high melting point metallic silicide film 112 at 500 angstroms to 3000 angstroms by a low pressure CVD method (FIG. 2B) and patterned using a photo resist to form the P$^+$-type gate electrode. Here, a nitride film may be used as the mask material. Then, an oxide film is formed at 100 angstrom to 500 angstroms to a gate electrode portion and on the surface of the semiconductor substrate by thermal oxidation, a low pressure CVD method, or the like (FIG. 2C). In addition, here, as the insulating film 113 on the P$^+$-type gate electrode, an insulating film having a laminate structure of an oxide film having a film thickness of, for example, 300 angstroms, a nitride film having a film thickness of 500 angstroms, which is formed by a CVD method, and a thermal oxide film having a film thickness of about 10 angstroms may be formed for forming a high quality capacitor.

Figure 2D:
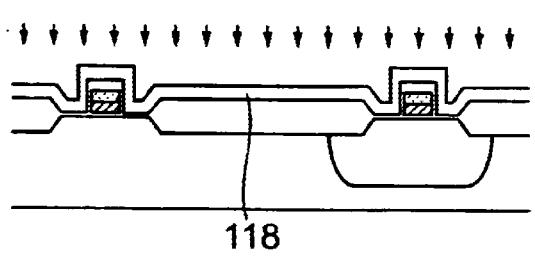
Figure 2E:
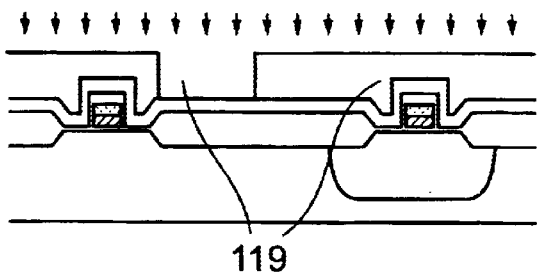

Next, as shown in FIG. 2D, a second polycrystalline silicon film 118 having a film thickness of, for example, 1000 angstroms is deposited on the entire surface by a CVD method or a sputtering method. Then, in order to form a low concentration P-type resistor, BF$_2$ ions as P-type impurities are implanted into the entire second polycrystalline silicon film 118 at a dose of, for example, $1 \times 10^{14}$ atoms/cm$^2$. Note that boron may be used instead of BF$_2$. After that, as shown in FIG. 2E, the second polycrystalline silicon film 118 is patterned using a photo resist 119 so as to form a low concentration N-type resistor region later and phosphorus ions are selectively implanted at a dose of, for example, $3 \times 10^{14}$ atoms/cm$^2$. At this time, in order to form the N-type resistor with stability, it is required that the dose of phosphorus is set to be equal to or more than two times that of BF$_2$. Note that arsenic may be used instead of phosphorus, Thus, when boron for setting a sheet resistance value of the P-type resistor is introduced in advance into the resistor region made of polycrystalline silicon which becomes the N-type later and then this resistor region (P-type) is changed into the N-type resistor region using phosphorus or arsenic as the N-type impurity. As a result, the sheet resistance value can be efficiently increased. Note that a method of performing ion implantation to respective resistor regions which become the P-type or the N-type later using masks such as photo resists may be used.

Figure 2F:
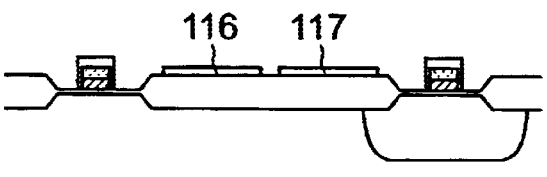

After that, the photo resist 119 is removed, and then patterning is performed using a photo resist and anisotropic dry etching such as RIE (reactive ion etching) is performed, thereby forming the polycrystalline silicon resistor 116 having the N-type as the first conductivity type and the polycrystalline silicon resistor 117 having the P-type as the second conductivity type, as shown in FIG. 2F.

Figure 2G:
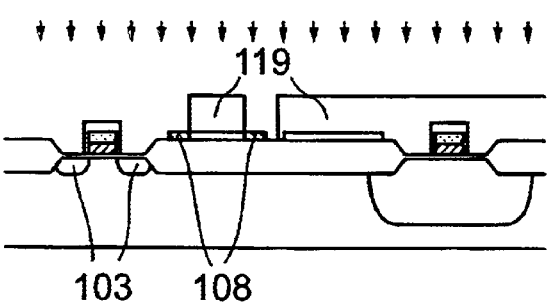
Figure 2H:
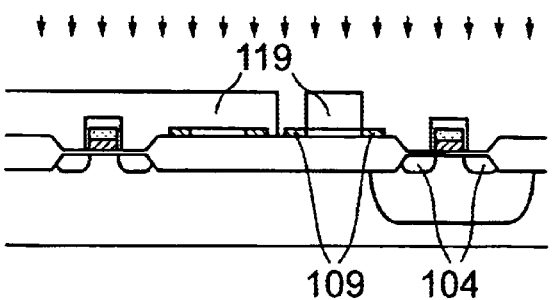
Figure 3:
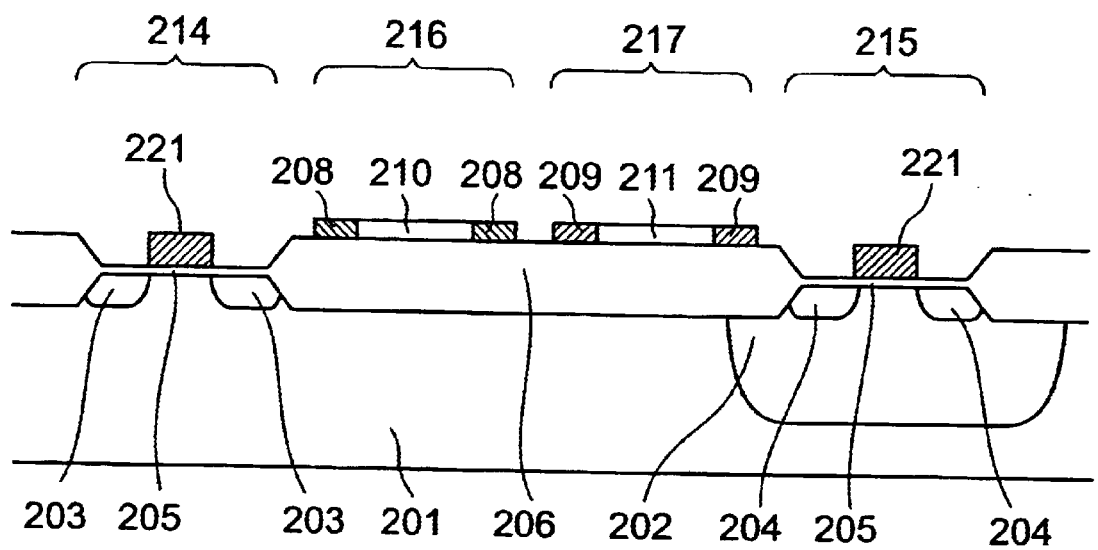
FIG. 3 is a schematic cross sectional view showing an example of a conventional CMOS semiconductor device.
Figure 4:
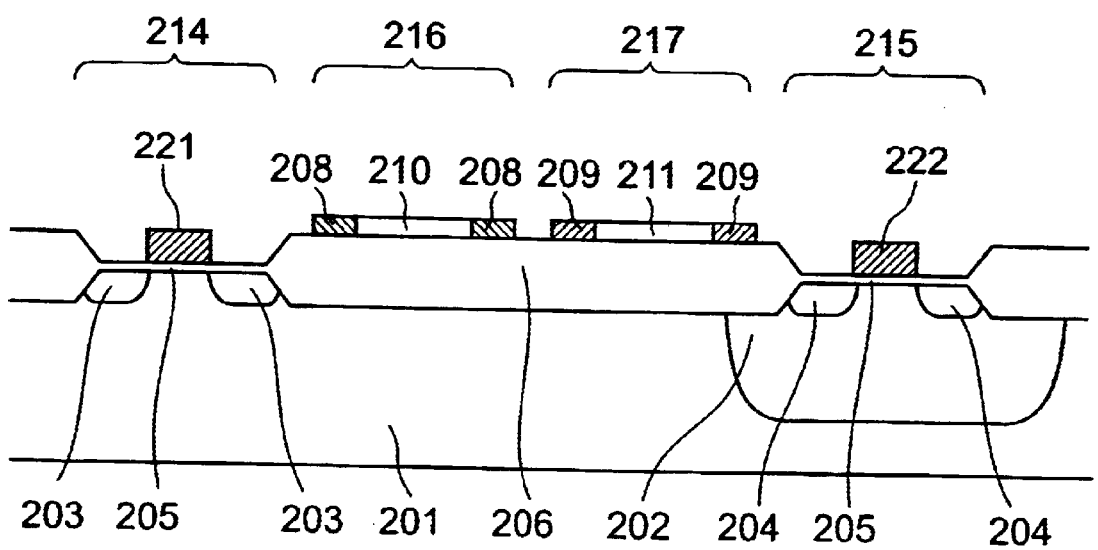
FIG. 4 is a schematic cross sectional view showing an example of a conventional CMOS semiconductor device.
Figure 5:
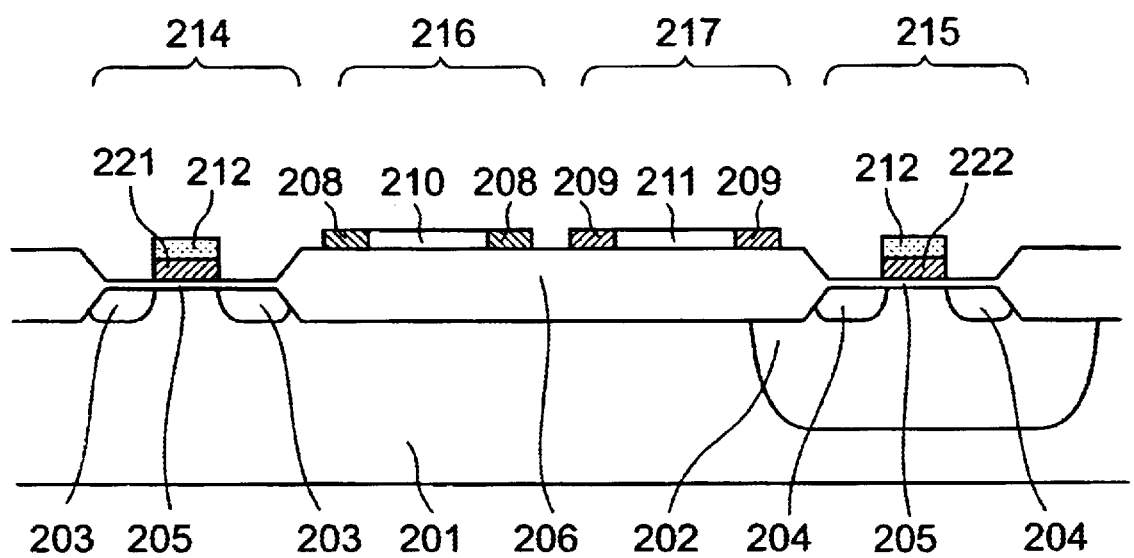
FIG. 5 is a schematic cross sectional view showing an example of a conventional CMOS semiconductor device.

Next, as shown in FIG. 2G, patterning is performed using a photo resist 119 and arsenic as the N-type impurity is doped at a dose of $5 \times 10^{15}$ atoms/cm$^2$ by an ion implantation method. As a result, the high concentration impurity regions 108 for sufficiently contacting an aluminum wiring in the second polycrystalline silicon resistor 116 having the N-type as the first conductivity type and N-type high concentration impurity regions 103 as the source and the drain of the NMOS transistor are simultaneously formed. Instead of the introduction of the N-type impurity into the second polycrystalline silicon resistor as shown in FIG. 2E, the N-type high concentration impurity in FIG. 2G can be doped into the entire region of the N-type resistor to form the N-type resistor having a relatively low resistance After the photo resist is removed, as shown in FIG. 2H, patterning is performed using a photo resist 119 and $BF_2$ as the P-type impurity is doped at a dose of $5 \times 10^{15}$ atoms/cm$^2$ by an ion implantation method. As a result, the high concentration impurity regions 109 for sufficiently contacting an aluminum wiring in the second polycrystalline silicon resistor 117 having the P-type as the second conductivity type and P-type high concentration impurity regions 104 as the source and the drain of the PMOS transistor are simultaneously formed. In FIG. 2H, the P-type high concentration impurity can be doped into the entire region of the P-type resistor to form the P-type resistor having a relatively low resistance.

After that, although not shown, as in a conventional semiconductor process, formation of an intermediate insulating film, formation of contact holes, formation of an aluminum wiring pattern, and formation of a protective film and patterning thereof are performed to produce the complementary MOS semiconductor device.

Thus, the embodiment mode of the present invention is described based on the embodiment using the P-type semiconductor substrate. Even when the polarity of the substrate is reversed and the P$^+$-type unipolar gate CMOS transistor of N-substrate P-well type is produced using the N-type semiconductor substrate, a semiconductor device achieving low voltage operation, low consumption power, and a low cost can be provided as in contents and principles as described above.

As described above, with respect to a power management semiconductor device and an analog semiconductor device which each include a CMOS transistor and a resistor, a manufacturing method of the present invention is a method of obtaining a P-type polycide structure as a laminate structure of a P-type polycrystalline silicon film and a high melting point metallic silicide film for the respective gate electrodes of the NMOS transistor and the PMOS transistor as divided by the conductivity type thereof in the CMOS transistor. In addition, the manufacturing method of the present invention is a semiconductor device manufacturing method of forming a resistor used for a voltage dividing circuit and a CR circuit using a polycrystalline silicon film as a layer different from the gate electrode so that a higher accurate resistor can be obtained. Thus, as compared with a conventional CMOS transistor having an N$^+$-type polycrystalline silicon gate unipole and a conventional homopolar gate CMOS transistor in which the channel and the gate electrode have the same polarity, it is an advantage in costs, manufacturing periods, and element performances. In addition, a power management semiconductor device and an analog semiconductor device which have high-grade function and high accuracy can be realized.

What is claimed is:

1. A method of manufacturing a semiconductor device comprising:

forming an element isolation insulating film on a semiconductor substrate by thermal oxidation;

forming a gate insulating film on the semiconductor substrate by thermal oxidation;

depositing a first polycrystalline silicon film at a thickness of 500 angstroms to 2500 angstroms on the gate isulating film;

doping the first polycrystalline silicon film with an impurity such that a concentration of the impurity is $1 \times 10^{18}$ atoms/cm$^3$ or higher to make a conductivity type of the first polycrystalline silicon film a P-type;

depositing a high melting point metallic silicide film having a thickness of 500 angstroms to 2500 angstroms on the first polycrystalline silicon film having the P-type;

depositing an insulating film having a thickness of 500 angstroms to 3000 angstroms on the high melting point metallic silicide film;

etching the first polycrystalline silicon film having the P-type, the high melting point metallic silicide film, and the insulating film to form a gate electrode;

depositing a second polycrystalline silicon film having a thickness of 500 angstroms to 2500 angstroms on the element isolation insulating film;

doping one of an entire region and a first region of the second polycrystalline silicon film with a first conductivity type impurity at a concentration of $1 \times 10^{14}$ atoms/cm$^3$ to $9 \times 10^{18}$ atoms/cm$^3$;

doping a second region of the second polycrystalline silicon film with a second conductivity type impurity at a concentration of $1 \times 10^{14}$ atoms/cm$^3$ to $9 \times 10^{18}$ atoms/cm$^3$;

etching the second polycrystalline silicon film to form a resistor composed of the second polycrystalline silicon film;

doping one of a portion and an entire region of the first region of the second polycrystalline silicon film with the first conductivity type impurity at a concentration of $1 \times 10^{19}$ atoms/cm$^3$ or higher;

doping one of a portion and an entire region of the second region of the second polycrystalline silicon film with the second conductivity type impurity at a concentration of $1 \times 10^{19}$ atoms/cm$^3$ or higher;

forming an intermediate insulating film over the semiconductor substrate;

forming a contact hole in the intermediate insulating film over the semiconductor substrate; and providing a metallic wiring in the contact hole.

2. A method of manufacturing a semiconductor device according to claim 1, wherein an impurity introducing method for the first polycrystalline silicon film is for an ion implantation of boron.

3. A method of manufacturing a semiconductor device according to claim 1, wherein an impurity introducing method for the first polycrystalline silicon film is for an ion implantation of $BF_2$.

4. A method of manufacturing a semiconductor device according to claim 1, wherein an impurity introducing method for the first polycrystalline silicon film is a doped-CVD method of depositing the first polycrystalline silicon film while the impurity is mixed thereinto.

5. A method of manufacturing a semiconductor device according to claim 1, wherein the insulating film deposited on the high melting point metallic silicide film is composed of an oxide film.

6. A method of manufacturing a semiconductor device according to claim 1, wherein the insulating film deposited on the high melting point metallic silicide film is composed of a nitride film.

7. A method of manufacturing a semiconductor device according to claim 1, wherein the insulating film deposited on the high melting point metallic silicide film is composed of a laminate of a first oxide film, a nitride film, and a second oxide film.

8. A method of manufacturing a semiconductor device according to claim 1, wherein doping of the first conductivity type impurity at a concentration of $1\times10^{19}$ atoms/cm$^3$ or higher to one of the portion and the entire region of the first region of the second polycrystalline silicon film is performed simultaneously with doping to a diffusion region of a first conductivity type MOS transistor, and doping of the second conductivity type impurity at a concentration of $1\times10^{19}$ atoms/cm$^3$ or higher to one of the portion and the entire region of the second region of the second polycrystalline silicon film is performed simultaneously with doping to a diffusion region of a second conductivity type MOS transistor.

* * * * *